United States Patent
Kim

(10) Patent No.: US 12,507,563 B2
(45) Date of Patent: Dec. 23, 2025

(54) DISPLAY DEVICE HAVING IMPROVED APERTURE RATIO AND RESOLUTION

(71) Applicant: LG DISPLAY CO., LTD., Seoul (KR)

(72) Inventor: Pu-Reum Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 472 days.

(21) Appl. No.: 18/076,696

(22) Filed: Dec. 7, 2022

(65) Prior Publication Data

US 2023/0217768 A1     Jul. 6, 2023

(30) Foreign Application Priority Data

Dec. 30, 2021  (KR) .................. 10-2021-0193271

(51) Int. Cl.
| | |
|---|---|
| *H01L 29/08* | (2006.01) |
| *H10D 86/40* | (2025.01) |
| *H10D 86/60* | (2025.01) |
| *H10K 59/121* | (2023.01) |
| *H10K 59/122* | (2023.01) |
| *H10K 59/131* | (2023.01) |
| *H10K 59/35* | (2023.01) |

(52) U.S. Cl.
CPC ......... *H10K 59/353* (2023.02); *H10D 86/441* (2025.01); *H10D 86/60* (2025.01); *H10K 59/1213* (2023.02); *H10K 59/1216* (2023.02); *H10K 59/122* (2023.02); *H10K 59/131* (2023.02)

(58) Field of Classification Search
CPC .. H10K 59/353; H10K 59/131; H10K 59/122; H10K 59/1213

USPC .......................................................... 257/40
See application file for complete search history.

(56) References Cited

U.S. PATENT DOCUMENTS 11,037,912 B1 *   6/2021  Meitl ................... H10H 20/857
2021/0097929 A1 *  4/2021  Li ......................... G09G 3/2007

FOREIGN PATENT DOCUMENTS

| CN | 107507573 A | * 12/2017 |
|---|---|---|
| KR | 10-2005-0030165 A | 3/2005 |
| KR | 10-2014-0117119 A | 10/2014 |
| KR | 10-2017-0124071 A | 11/2017 |

(Continued)

OTHER PUBLICATIONS

Cite the machine translation Huang T (CN-107507573-A).*

*Primary Examiner* — Phuc T Dang
(74) *Attorney, Agent, or Firm* — Birch, Stewart, Kolasch & Birch, LLP

(57) ABSTRACT

A display device including a plurality of pixels disposed on a substrate, wherein each pixel includes a first subpixel, a second subpixel adjacent to the first subpixel, and a third subpixel adjacent to the second subpixel. Further, each of the first subpixel and the third subpixel include a single light emitting diode corresponding to a single light emission region, and the second subpixel includes a first light emitting diode corresponding to a first sub-emission region, and a second light emitting diode corresponding to a second sub-emission region. The display device also includes a controller configured to control only the first light emitting diode of the second subpixel to emit light during a low gray level mode, and control the first light emitting diode and the second light emitting diode of the second subpixel to both emit light in a high gray level mode.

19 Claims, 7 Drawing Sheets

(56) References Cited

FOREIGN PATENT DOCUMENTS

| KR | 10-2019-0064085 A | 6/2019 |
| KR | 10-2021-0037949 A | 4/2021 |

\* cited by examiner

DISPLAY DEVICE HAVING IMPROVED APERTURE RATIO AND RESOLUTION

CROSS-REFERENCE TO RELATED APPLICATIONS

The present application claims priority under 35 U.S.C § 119(a) to Korean Patent Application No. 10-2021-0193271 filed in the Republic of Korea on Dec. 30, 2021, the entire contents of which are hereby expressly incorporated by reference in its entirety into the present application.

BACKGROUND OF THE DISCLOSURE

Field of the Disclosure

The present disclosure relates to a display device for improving efficiency of blue light in a low gray level.

Discussion of the Related Art

Recently, with the development of multimedia, the importance of a flat panel display device is increasing and flat panel display devices such as a liquid crystal display device, a plasma display device, an organic electroluminescence display device, and the like have been commercialized. Among these flat panel display devices, the organic electroluminescence display device is currently widely used because it has a high response speed, high luminance, and wide viewing angles.

As virtual reality and augmented reality have recently drawn more attention, the demand for a display device having a high resolution and a compact size is increasing. However, it has been difficult to satisfy such a high resolution and compactness with the existing organic electroluminescence display device.

SUMMARY OF THE DISCLOSURE

Accordingly, one object of the present disclosure is to provide a display device that substantially obviates one or more of the problems due to limitations and disadvantages of the related art.

Another object of the present disclosure is to provide a display device capable of improving blue luminous efficiency and preventing color shift due to leakage current.

To achieve these and other advantages and in accordance with the purpose of the present disclosure, as embodied and broadly described herein, the present invention provides a display device including a plurality of pixels disposed on a substrate, wherein each pixel includes a first subpixel, a second subpixel adjacent to the first subpixel, and a third subpixel adjacent to the second subpixel. Further, each of the first subpixel and the third subpixel include a single light emitting diode corresponding to a single light emission region, and the second subpixel includes a first light emitting diode corresponding to a first sub-emission region, and a second light emitting diode corresponding to a second sub-emission region. The display device also includes a controller configured to control only the first light emitting diode of the second subpixel to emit light during a low gray level mode, and control the first light emitting diode and the second light emitting diode of the second subpixel to both emit light in a high gray level mode.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the disclosure.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION OF THE EMBODIMENTS

Figure 1:
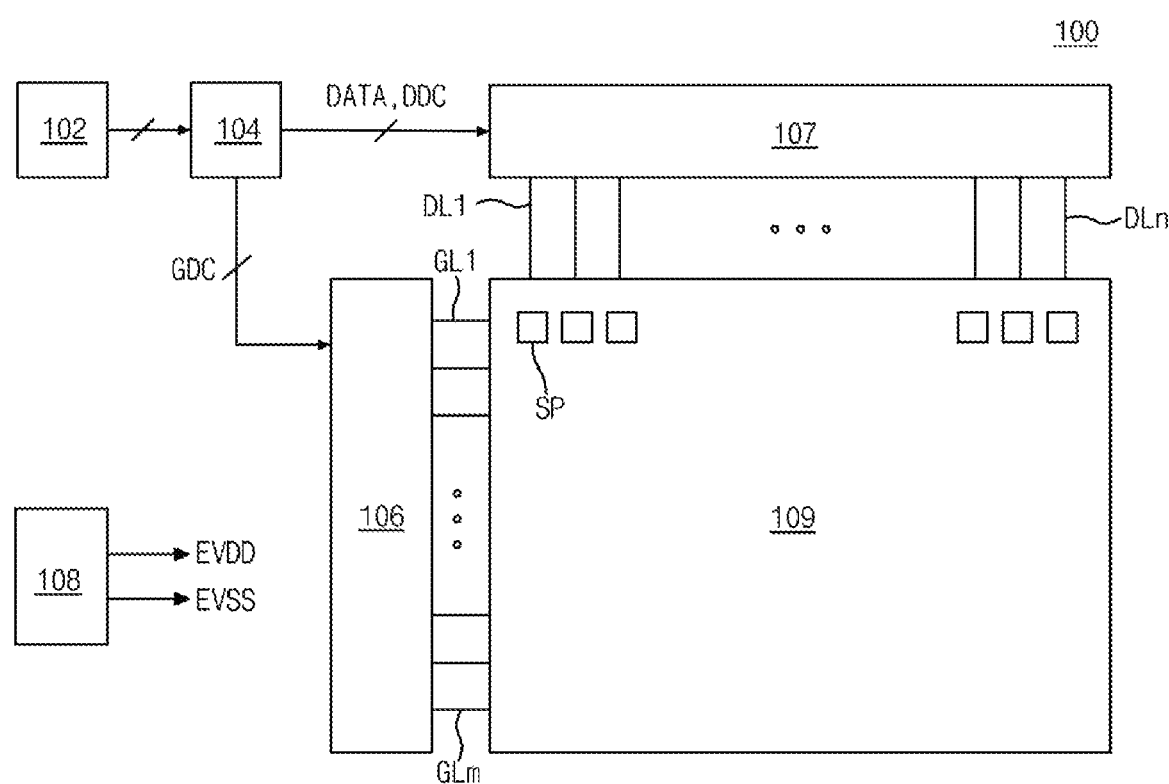
FIG. 1 is a schematic block diagram of an organic electroluminescence display device according to an embodiment of the present disclosure.

Advantages and features of the present disclosure and methods for achieving them will be made clear from embodiments described in detail below with reference to the accompanying drawings. The present disclosure can, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "consisting of," and the like mentioned in this disclosure are used, other parts can be added unless the term "only" is used herein. When a component is expressed as being singular, being plural is included unless otherwise specified.

In analyzing a component, an error range is interpreted as being included even when there is no explicit description. In describing a positional relationship, for example, when a positional relationship of two parts is described as being "on," "above," "below," "next to," or the like, unless "immediately" or "directly" is not used, one or more other parts can be located between the two parts.

In describing a temporal relationship, for example, when a temporal predecessor relationship is described as being "after," "subsequent," "next to," "prior to," or the like, unless "immediately" or "directly" is not used, cases that are not continuous can also be included.

Although the terms first, second, and the like are used to describe various components, these components are not substantially limited by these terms. These terms are used only to distinguish one component from another component. Therefore, a first component described below can substantially be a second component within the technical spirit of the present disclosure.

Features of various embodiments of the present disclosure can be partially or entirely united or combined with each other, technically various interlocking and driving are possible, and each of the embodiments can be independently implemented with respect to each other or implemented together in a related relationship.

Hereinafter, the present disclosure will be described in detail with reference to accompanying drawings. The present disclosure can be applied to various display devices. For example, the present disclosure can be applied to various display devices such as a liquid crystal display device, an organic electroluminescence display device, and an electrophoretic display device, but for convenience of explanation, only the organic electroluminescence display device will be described below.

Figure 2:
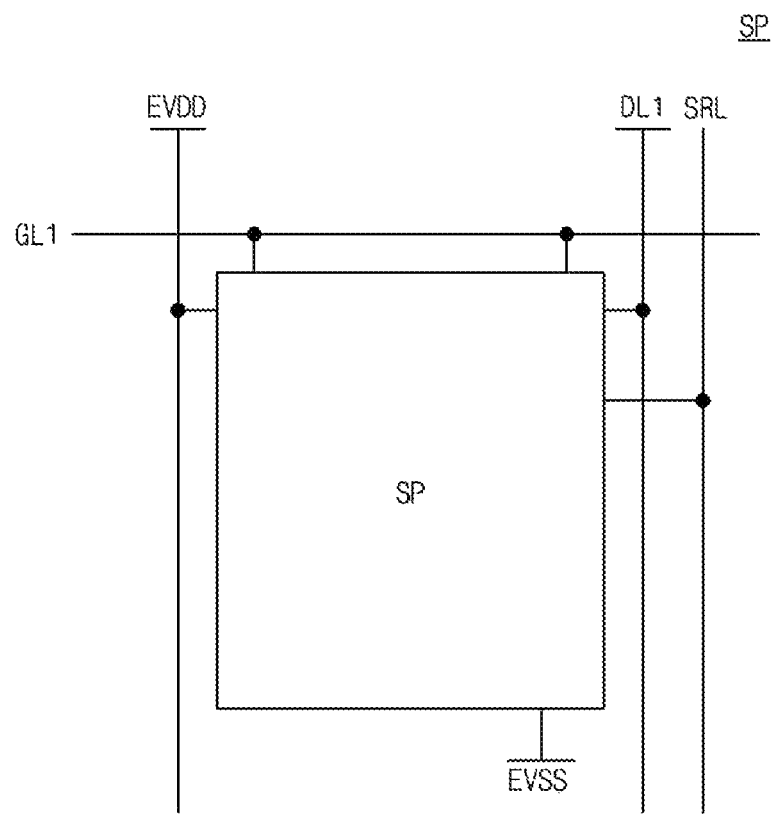
FIG. 2 is a schematic block diagram of a sub-pixel shown in FIG. 1.

FIG. 1 is a schematic block diagram of an organic electroluminescence display device according to the present disclosure, and FIG. 2 is a schematic block diagram of a sub-pixel shown in FIG. 1.

In FIG. 1, the organic electroluminescence display device 100 includes an image processing portion 102, a timing control portion 104, a gate driving portion 106, a data driving portion 107, a power supply portion 108, and a display panel 109. The processing portion 102, timing control portion 104, the gate driving portion, data driving portion 107 and the power supply portion can include the appropriate hardware-embedded processors for executing the appropriate algorithms for performing the described functions.

The image processing portion 102 outputs an image data supplied from the outside and outputs driving signals for driving various components. For example, the driving signals output from the image processing portion 102 include a data enable signal, a vertical synchronization signal, a horizontal synchronization signal, and a clock signal.

The timing control portion 104 receives the image data and the driving signals from the image processing portion 102. The timing control portion 104 generates and outputs a gate timing control signal GDC for controlling the operation timing of the gate driving portion 106 and a data timing control signal DDC for controlling the operation timing of the data driving portion 107 based on the driving signals input from the image processing portion 102.

The gate driving portion 106 outputs a scan signal to the display panel 109 in response to the gate timing control signal GDC supplied from the timing control portion 104. The gate driving portion 106 outputs the scan signal through a plurality of gate lines GL1~GLm. In this instance, the gate driving portion 106 can be an integrated circuit (IC) but is not limited thereto.

Further, the data driving portion 107 outputs a data voltage to the display panel 109 in response to the data timing control signal DDC input from the timing control portion 104. The data driving portion 107 samples and latches a digital data signal DATA supplied from the timing control portion 104 and converts it to an analog data voltage based on the gamma voltage. Further, the data driving portion 107 outputs the data voltage through a plurality of data lines DL1~DLn. In this instance, the data driving portion 107 can be an integrated circuit (IC) but is not limited thereto.

The power supply portion 108 outputs a high potential voltage VDD and a low potential voltage VSS and supplies the voltages to the display panel 109. The high potential voltage VDD is supplied to the display panel 109 through a first power line EVDD, and the low potential voltage VSS is supplied to the display panel 109 through a second power line EVSS. Further, a voltage output from the power supply portion 108 is output to the gate driving portion 106 or the data driving portion 107 to be used for driving the driving portions.

In addition, the display panel 109 displays an image corresponding to the scan signal and the data voltage supplied from the gate driving portion 106 and the data driving portion 107 and a power voltage supplied from the power supply portion 108. The display panel 109 includes a plurality of sub-pixels SP for realizing the image. The sub-pixels SP include a red (R) sub-pixel, a green (G) sub-pixel, and a blue (B) sub-pixel. Here, the R, G, and B sub-pixels SP may have the same area or different areas.

In FIG. 2, one sub-pixel SP is connected to a gate line GL1, a data line DL1, the first power line EVDD, the second power line EVSS and a sensing line SRL. The numbers of transistors and capacitors of the sub-pixel and a driving method thereof are determined according to the configuration of a pixel circuit.

Figure 3A:
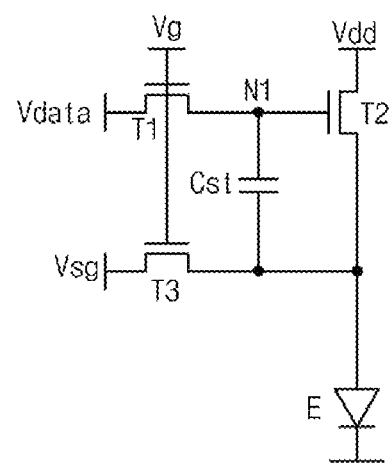
FIG. 3A is a circuit diagram of R and G sub-pixels of an organic electroluminescence display device according to an embodiment of the present disclosure.
Figure 3B:
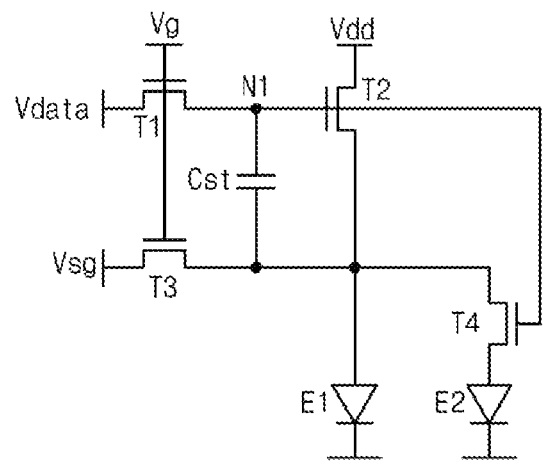
FIG. 3B is a circuit diagram of a B sub-pixel of an organic electroluminescence display device according to an embodiment of the present disclosure.

Next, FIGS. 3A and 3B are circuit diagrams of sub-pixels of an organic electroluminescence display device according to a first embodiment of the present disclosure. In particular, FIG. 3A is the circuit diagram of R and G sub-pixels, and FIG. 3B is the circuit diagram of B sub-pixel.

As shown, the B sub-pixel includes two sub-light emitting diodes E1 and E2 (FIG. 3B), and each of the R and G sub-pixels includes one light emitting diode E (FIG. 3A). However, the present disclosure is not limited thereto. Alternatively, the G sub-pixel may include two sub-light emitting diodes E1 and E2 and each of the R and B sub-pixels may include one light emitting diode E, or the R sub-pixel may include two sub-light emitting diodes E1 and E2 and each of the G and B sub-pixels may include one light emitting diode E.

In FIG. 3A, each of the R and G sub-pixels includes a switching thin film transistor T1, a driving thin film transistor T2, a storage capacitor Cst, a sensing thin film transistor T3, and a light emitting diode E.

Because the R and G sub-pixels of the organic electroluminescence display device include three thin film transistors and one capacitor, the structure can be referred to as 3T1C structure. However, the structure of the R and G sub-pixels is not limited thereto. Alternatively, the R and G sub-pixels can have one of various compensation structures such as a 4T1C structure including four thin film transistors and one capacitor, a 4T2C structure including four thin film transistors and two capacitors, a 5T2C structure including five thin film transistors and two capacitors, a 6T2C structure including six thin film transistors and two capacitors, and a 7T2C structure including seven thin film transistors and two capacitors.

Each of the three thin film transistors, that is, the switching thin film transistor T1, the driving thin film transistor T2, and the sensing thin film transistor T3 of the R and G sub-pixels include, for example, a semiconductor layer, a gate electrode, a source electrode, and a drain electrode and can be a P-type thin film transistor or an N-type thin film transistor. For convenience of explanation, the N-type thin film transistors are shown in FIGS. 3A and 3B.

Further, the switching thin film transistor T1 includes a drain electrode connected to a data line, a source electrode connected to a first node N1, and a gate electrode connected to a gate line. The switching thin film transistor T1 turns on based on the gate voltage Vg supplied from the gate driving portion to the gate line and charges the first node N1 with the data voltage Vdata applied from the data driving portion to the data line.

In addition, the driving thin film transistor T2 includes a drain electrode connected to a high potential line, for example, a Vdd line, a source electrode connected to an anode of the light emitting diode E, and a gate electrode connected to the first node N1. The driving thin film transistor T2 turns on when a voltage of the first node N1 is higher than a threshold voltage Vth and turns off when the voltage of the first node N1 is lower than the threshold voltage Vth. Further, the driving thin film transistor T2 transfers the driving current received from the Vdd line to the light emitting diode E.

As shown, the storage capacitor Cst includes an electrode connected to the first node N1 and an electrode connected to the source electrode of the driving thin film transistor T2. The storage capacitor Cst maintains a potential difference between the gate electrode and the source electrode of the driving thin film transistor T2 during an emission time when the light emitting diode E emits light, thereby transmitting a constant driving current to the light emitting diode E.

As shown, the sensing thin film transistor T3 includes a drain electrode connected to a sensing line supplying a reference voltage or an initialization voltage Vsg or detecting a sensing voltage, a source electrode connected to the source electrode of the driving thin film transistor T2, and a gate electrode connected to the gate line. The sensing thin film transistor T3 is a thin film transistor for sensing the threshold voltage Vth of the driving thin film transistor T2.

In FIG. 3B, the B sub-pixel includes a switching thin film transistor T1, a driving thin film transistor T2, a storage capacitor Cst, a sensing thin film transistor T3, an emission control thin film transistor T4, and two sub-light emitting diodes E1 and E2. In addition, one unit pixel includes R, G and B sub-pixels. The B sub-pixel includes two sub-emission regions, and the sub-light emitting diodes E1 and E2 are disposed in the two sub-emission regions, respectively. As described above, while each of the R sub-pixel and the G sub-pixel has one sub-emission region and one sub-light emitting diode, the B sub-pixel has two sub-emission regions and includes two sub-light emitting diodes E1 and E2, that is, first and second sub-light emitting diodes E1 and E2.

Further, the two sub-light emitting diodes E1 and E2 of the B sub-pixel are connected to one gate line and one data line. Namely, the same gate signal and the same data signal are applied to the two sub-light emitting diodes E1 and E2 of the B sub-pixel.

The structure of the B sub-pixel is similar to the structure of the R and G sub-pixels except that the emission control thin film transistor T4 is further provided. That is, the B sub-pixel further has the emission control thin film transistor T4, thereby including two sub-emission regions.

The emission control thin film transistor T4 controls the driving of the second sub-light emitting diode E2 according to a gray level. That is, the emission control thin film transistor T4 blocks the current applied to the second sub-light emitting diode E2 in a low gray level to drive only the first sub-light emitting diode E1 and allows the current to flow through the second sub-light emitting diode E2 in a high gray level to drive the first and second sub-light emitting diodes E1 and E2.

Also, a gate electrode of the emission control thin film transistor T4 is connected to the first node N1, and a drain electrode of the emission control thin film transistor T4 is connected to the source electrode of the sensing thin film transistor T3. In addition, a source electrode of the emission thin film transistor T4 is connected to the anode of the second sub-light emitting diode E2.

Figure 4:
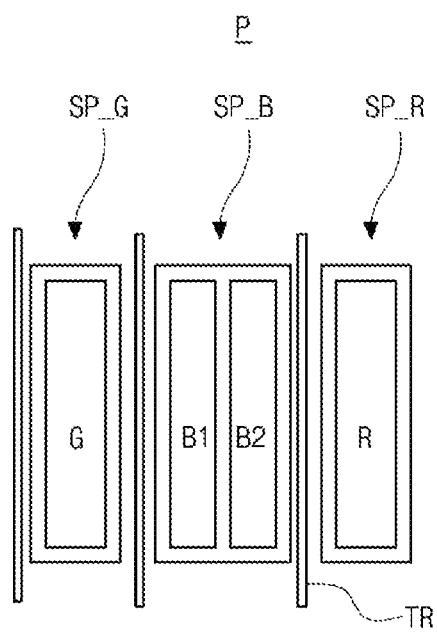
FIG. 4 is a plan view schematically illustrating a pixel of an organic electroluminescence display device according to a first embodiment of the present disclosure.

Next, FIG. 4 is a plan view schematically illustrating a structure of a pixel of an organic electroluminescence display device according to the first embodiment of the present disclosure. As shown in FIG. 4, one pixel P includes R, G, and B sub-pixels SP_R, SP_G, and SP_B, and the B sub-pixel SP_B includes first and second sub-emission regions B1 and B2. Here, the area of the B sub-pixel SP_B is larger than the area of each of the R and G sub-pixels SP_R and SP_G, and a trench TR is formed or disposed between the R, G, and B sub-pixels SP_R, SP_G, and SP_B.

More specifically, the trench TR is formed between the R and B sub-pixels SP_R and SP_B and between the G and B sub-pixels SP_G and SP_B. In addition, the trench TR is formed between the G sub-pixel SP_G and an R sub-pixel of a pixel adjacent to the pixel P. The trench TR may be further formed between the R sub-pixel SP_R and a G sub-pixel of another pixel adjacent to the pixel P.

In addition, the first and second sub-emission regions B1 and B2 are adjacent to each other along a horizontal direction, for example, a longitudinal direction of the gate line, but is not limited thereto. The trench TR is also not formed between the first and second sub-emission regions B1 and B2.

As described above, the R and G sub-pixels SP_R and SP_G each include one sub-emission region, and the B sub-pixel SP_B includes two sub-emission regions. The reason is as follows.

Generally, in an organic light emitting element that is composed of a plurality of stacks and emits white light, a blue light emitting layer emitting blue light has a lower luminous efficiency than a red light emitting layer and a green light emitting layer. When the light emitting layers of different colors have different luminous efficiencies, the image quality is lowered due to the difference in luminance between the colors.

Also, in the related art organic light emitting element, a lateral leakage current is generated between adjacent sub-pixels, and the lateral leakage current causes a color shift. Additionally, because a turn-on voltage of the B sub-pixel is higher than a turn-on voltage of the R and G sub-pixels, the B sub-pixel turns on the latest when a voltage is applied to the R, G, and B sub-pixels. Accordingly, the color shift occurs in the B sub-pixel.

In more detail, the color shift in the B sub-pixel mainly occurs in a low gray level driving. In particular, the color shift occurs as the set-up gray level is changed in the set-up sub-pixel. When the gray level of the sub-pixel is changed due to the lateral leakage current or the like, and when the same leakage current is applied, the gray level change is insignificant in the high gray level, but the gray level change is relatively large in the low gray level. Accordingly, the color shift according to the gray level change mainly occurs in the low gray level driving.

In the organic electroluminescence display device according to the first embodiment of the present disclosure, the pixel P is configured to include the R and G sub-pixels SP_R and SP_G each having one sub-emission region and the B sub-pixel SP_B having two sub-emission regions, so that the problem occurring in the related art organic electroluminescence display device as described above can be solved.

That is, the B sub-pixel SP_B is configured to have two sub-emission regions B1 and B2, and the area of the B sub-pixel SP_B is made larger than the area of the sub-pixels R and G sub-pixels SP_R and SP_G, thereby compensating for the decrease of the luminous efficiency in the B sub-pixel SP_B.

Further, in the organic electroluminescence display device according to the first embodiment of the present disclosure, the trench TR is formed between the R, G, and B sub-pixels SP_R, SP_G, and SP_B to disconnect an organic light emitting layer between adjacent sub-pixels. Accordingly, it is possible to prevent the lateral leakage current from occurring along the organic light emitting layer, and thus the color shift due to the lateral leakage current can be prevented.

Furthermore, in the organic electroluminescence display device according to the first embodiment of the present disclosure, each of the R and G sub-pixels SP_R and SP_G has one sub-emission region, and the B sub-pixel SP_B has two sub-emission regions, that is, first and second sub-emission regions B1 and B2.

The first sub-emission region B1 is adjacent to the G sub-pixel SP_G on the left and adjacent to the second sub-emission region B2 on the right in the context of the figure. In the related art organic electroluminescence display device, the G sub-pixel and the R sub-pixel are disposed on the left and right sides of the B sub-pixel, respectively, so that the B sub-pixel is adjacent to the sub-pixels of two different colors. On the other hand, in the organic electroluminescence display device according to an embodiment of the present disclosure, the first sub-emission region B1 of the B sub-pixel SP_B is adjacent to only one sub-pixel of a different color, that is, the G sub-pixel SP_G.

Accordingly, in the low gray level driving, because only the first sub-emission region B1 is driven, the leakage current applied from the adjacent sub-pixel to the first sub-emission region B1 is penetrated only through the G sub-pixel SP_G, so that the leakage current applied to the first sub-emission region B1 can be reduced. Therefore, because it is possible to reduce the change in the gray level of the displayed image, the color shift due to the lateral leakage current can be further effectively prevented.

Also, in the high gray level driving, because both the first sub-emission region B1 and the second sub-emission region B2 are driven and the B sub-pixel SP_B is adjacent to the G sub-pixel SP_G and the R sub-pixel SP_R, the lateral leakage current is applied from the G sub-pixel SP_G and the R sub-pixel SP_R to the B sub-pixel SP_B. Accordingly, in the high gray level driving, the color shift can occur due to the lateral leakage current.

However, in the high gray level driving, although the color shift occurs similarly in the low gray level driving, the gray level change of the image is relatively small because of the high gray level of the displayed image. In other words, because the high gray level is less influenced by the lateral leakage current than the low gray level, there is no substantial deterioration in the image quality in the high gray level driving. Further, the driving of the first sub-emission region B1 and the second sub-emission region B2 of the B sub-pixel SP_B can be controlled by the emission control thin film transistor T4.

Figure 5A:
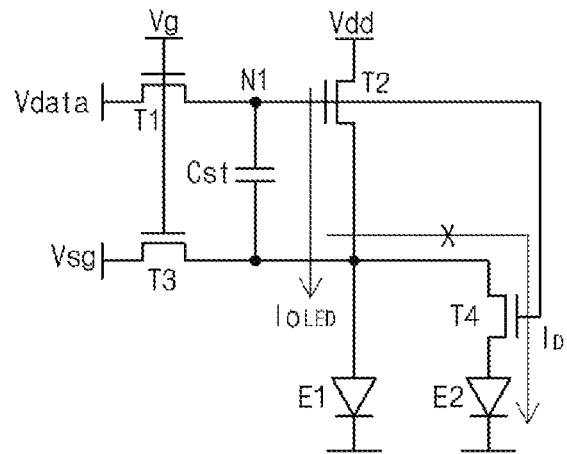
FIG. 5A is a view illustrating the current supply of the B sub-pixel in the low gray level driving of the first sub-emission region and the second sub-emission region.
Figure 5B:
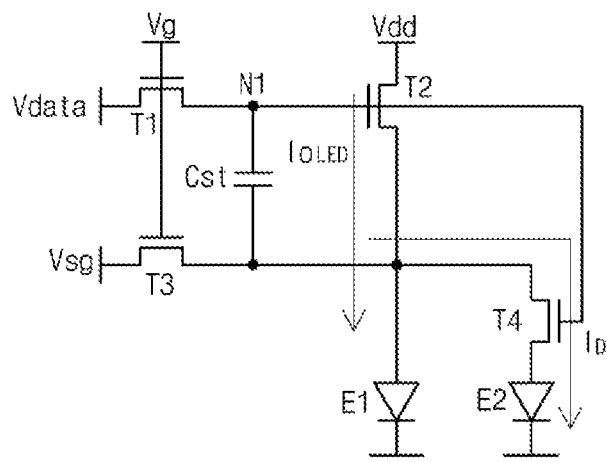
FIG. 5B is a view illustrating the current supply of the B sub-pixel in the high gray level driving.
Figure 5C:
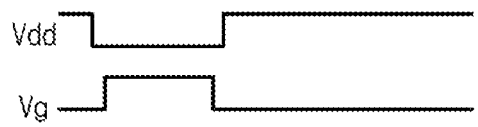
FIG. 5C is a view illustrating signal waveforms of an organic electroluminescence display device according to a first embodiment of the present disclosure.

Next, FIG. 5A is a view illustrating the current supply of the B sub-pixel SP_B in the low gray level driving of the first sub-emission region B1 and the second sub-emission region B2 of the B sub-pixel SP_B, FIG. 5B is a view illustrating the current supply of the B sub-pixel SP_B in the high gray level driving, and FIG. 5C is a view illustrating signal waveforms.

The operation in the sensing period before the emission period will be described with reference to FIGS. 5A to 5C. Here, the switching thin film transistor T1, the driving thin film transistor T2, the sensing thin film transistor T3, and the emission control thin film transistor T4 are referred to as a first thin film transistor, a second thin film transistor, a third thin film transistor, and a fourth thin film transistor, respectively. When the gate voltage Vg is applied, the first thin film transistor T1 and the third thin film transistor T3 turn on. As a result, the data voltage Vdata is applied to the gate electrode of the second thin film transistor T2 and the gate electrode of the fourth thin film transistor T4, so that the second thin film transistor T2 and the fourth thin film transistor T4 turn on. As the second thin film transistor T2 and the fourth thin film transistor T4 turn on, a reference voltage, for example, 0V voltage is applied to the source electrode of the second thin film transistor T2 and the drain electrode of the fourth thin film transistor T4.

The 0V voltage is also applied to the high potential line, that is, the Vdd line. The data voltage Vdata is stored in the storage capacitor Cst. At this time, the 0V voltage is applied to the anode of the first sub-light emitting diode E1, and the first sub-light emitting diode E1 does not emit light. In addition, because the 0V voltage is applied to the drain electrode of the fourth thin film transistor T4, a sufficient voltage cannot be applied to the second sub-light emitting diode E2, and thus the second sub-light emitting diode E2 also does not emit light.

Next, in the emission period, a gate-source voltage Vgs of the second thin film transistor T2 is determined by the data voltage Vdata stored in the storage capacitor Cst, and the current $I_{OLED}$ is supplied to the first sub-light emitting diode E1, so that the first sub-light emitting diode E1 starts to emit light. In this instance, the fourth thin film transistor T4 functions as a switch. That is, the fourth thin film transistor T4 acts as a high resistance Ron in the low gray level driving to block the supply of the current to the second sub-light emitting diode E2. As the gray level increases, the resistance Ron decreases, and the fourth thin film transistor T4 has a low resistance Ron in the high gray level driving to supply the current to the second sub-light emitting diode E2.

The resistance Ron of the fourth thin film transistor T4 is expressed by Equation 1 below. When the fourth thin film transistor T4 functions as the switch, it operates in a linear region.

$$R_{on} = \frac{V_{DS}}{I_D} = \frac{1}{K_n \frac{W}{L}(V_{GS} - V_{Th})} \quad \text{Equation 1}$$

Here, $V_{DS}$ is the drain-source voltage of the fourth thin film transistor T4, $I_D$ is the current flowing through the fourth thin film transistor T4, Kn is the intrinsic constant of the fourth thin film transistor T4, W is the width of the channel of the fourth thin film transistor T4, L is the length of the channel of the fourth thin film transistor T4, $V_{GS}$ is the gate-source voltage of the fourth thin film transistor T4, and $V_{Th}$ is the threshold voltage of the fourth thin film transistor T4.

As described in Equation 1, the resistance Ron of the fourth thin film transistor T4 is proportional to the current $I_D$ flowing through the fourth thin film transistor T4. In addition, the resistance Ron of the fourth thin film transistor T4 is inversely proportional to the gate-source voltage $V_{GS}$ of the fourth thin film transistor T4.

Accordingly, in the low gray level driving, because the current $I_D$ flowing through the fourth thin film transistor T4 is relatively small and the gate-source voltage $V_{GS}$ is relatively low, the resistance Ron of the fourth thin film transistor T4 increases. As shown in FIG. 5A, the current is not supplied to the second sub-light emitting diode E2, and the current is supplied to only the first sub-light emitting diode E1, so that only the first sub-light emitting diode E1 emits light.

On the other hand, in the high gray level driving, because the current $I_D$ flowing through the fourth thin film transistor T4 is relatively large and the gate-source voltage $V_{GS}$ is relatively high, the resistance Ron of the fourth thin film transistor T4 decreases. As shown in FIG. 5B, the current is supplied to the second sub-light emitting diode E2 as well as the first sub-light emitting diode E1, so that both the first sub-light emitting diode E1 and the second sub-light emitting diode E2 emit light.

As described above, in the display device according to the first embodiment of the present disclosure, two sub-emission regions are provided in the B sub-pixel, and one or two sub-light emitting diodes are driven according to the gray level, so that the non-uniform luminance and the color shift in the low gray level can be prevented.

Hereinafter, the organic electroluminescence display device 100 according to the first embodiment of the present disclosure will be described in more detail. In particular, FIG. 6 is a perspective view schematically illustrating a structure of the organic electroluminescence display device 100 according to the first embodiment of the present disclosure.

The organic electroluminescence display device 100 according to the present disclosure can be applied to various structures. Hereinafter, a so-called OLEDoS (organic light emitting diode on silicon) structure will be described in which an organic light emitting diode is formed on a silicon wafer substrate using a semiconductor process. However, the present disclosure is not limited to the organic electroluminescence display device 100 having such a structure.

Figure 6:
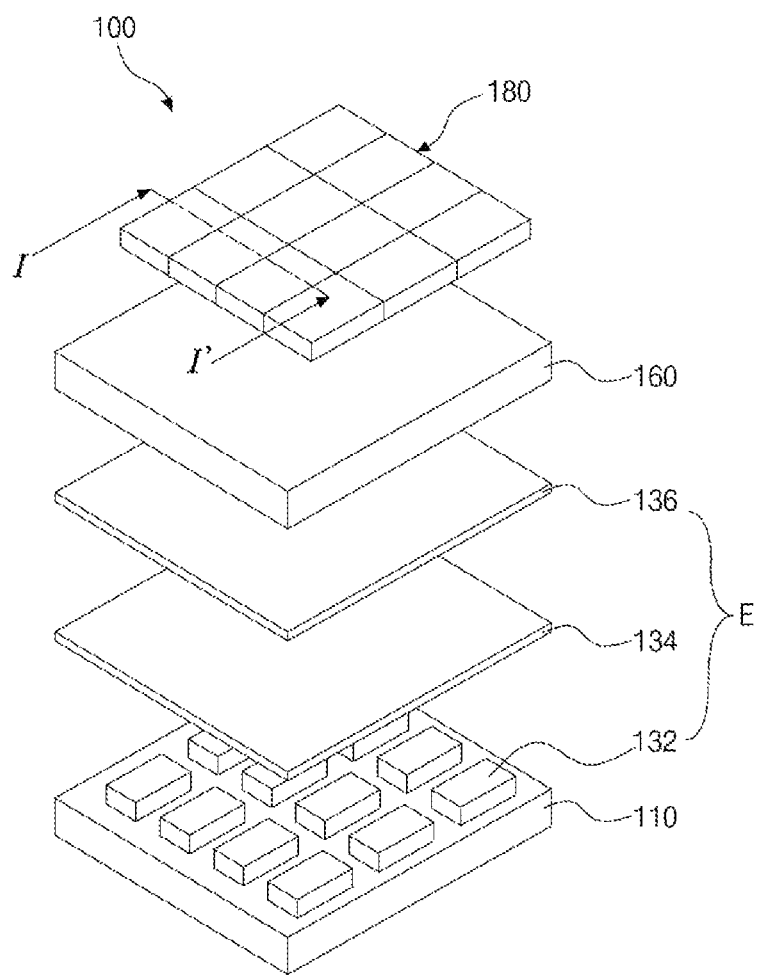
FIG. 6 is a perspective view schematically illustrating the organic electroluminescence display device according to the first embodiment of the present disclosure.

In FIG. 6, the organic electroluminescence display device 100 according to the first embodiment of the present disclosure includes a wafer substrate 110, a first electrode 132, an organic light emitting layer 134, a second electrode 136, an encapsulation layer 160, and a color filter layer 180. The wafer substrate 110 may be a silicon wafer substrate formed using a semiconductor process. An active layer may be formed in the wafer substrate 110, and a gate line, a data line, and a transistor may be formed on a top surface of wafer substrate 110.

The first electrode 132, the organic light emitting layer 134, and the second electrode 136 are sequentially formed to constitute an organic light emitting diode E. The first electrodes 132 are arranged on the wafer substrate 110 to correspond to the R sub-pixel, the G sub-pixel, and the B sub-pixel, respectively and are spaced apart from each other.

The organic light emitting layer 134 is formed over a substantially entire upper portion of the wafer substrate 110 to cover the wafer substrate 110 and the first electrode 132. The organic light emitting layer 134 is commonly formed for the R, G, and B sub-pixels to emit white light in these sub-pixels.

Further, the second electrode 136 is formed on the organic light emitting layer 134. The second electrode 136 is formed over all sub-pixels to apply a signal to all sub-pixels at the same time. The encapsulation layer 160 is formed on the second electrode 136 to prevent oxygen or moisture from penetrating into the organic light emitting diode E. The encapsulation layer 160 may include a plurality of layers of an inorganic layer and an organic layer.

The color filter layer 180 is formed on the encapsulation layer 160. The color filter layer 180 includes an R color filter, a G color filter, and a B color filter. In this case, the B color filter is formed as one body corresponding to the first sub-emission region B1 and the second sub-emission region B2.

In the organic electroluminescence display device 100 having an OLEDoS structure, because the active layer is formed on the wafer substrate 110 to form the thin film transistor, a single crystal thin film transistor having an excellent electrical mobility can be formed. Accordingly, it is possible to significantly reduce the size of the sub-pixel, so that a high-resolution display device can be manufactured. In addition, in the organic electroluminescence display device 100 having an OLEDoS structure, the transistors of the gate driving portion and the data driving portion as well as the thin film transistors in the sub-pixels can be formed as single crystal transistors, and thus, it is possible to obtain a fast response speed.

The organic electroluminescence display device 100 having an OLEDoS structure can be applied to various fields. For example, the organic electroluminescence display device 100 having an OLEDoS structure can be applied to a metaverse device that represents a virtual world based on virtual reality (VR) and augmented reality (AR), which have been in the spotlight recently.

Figure 7:
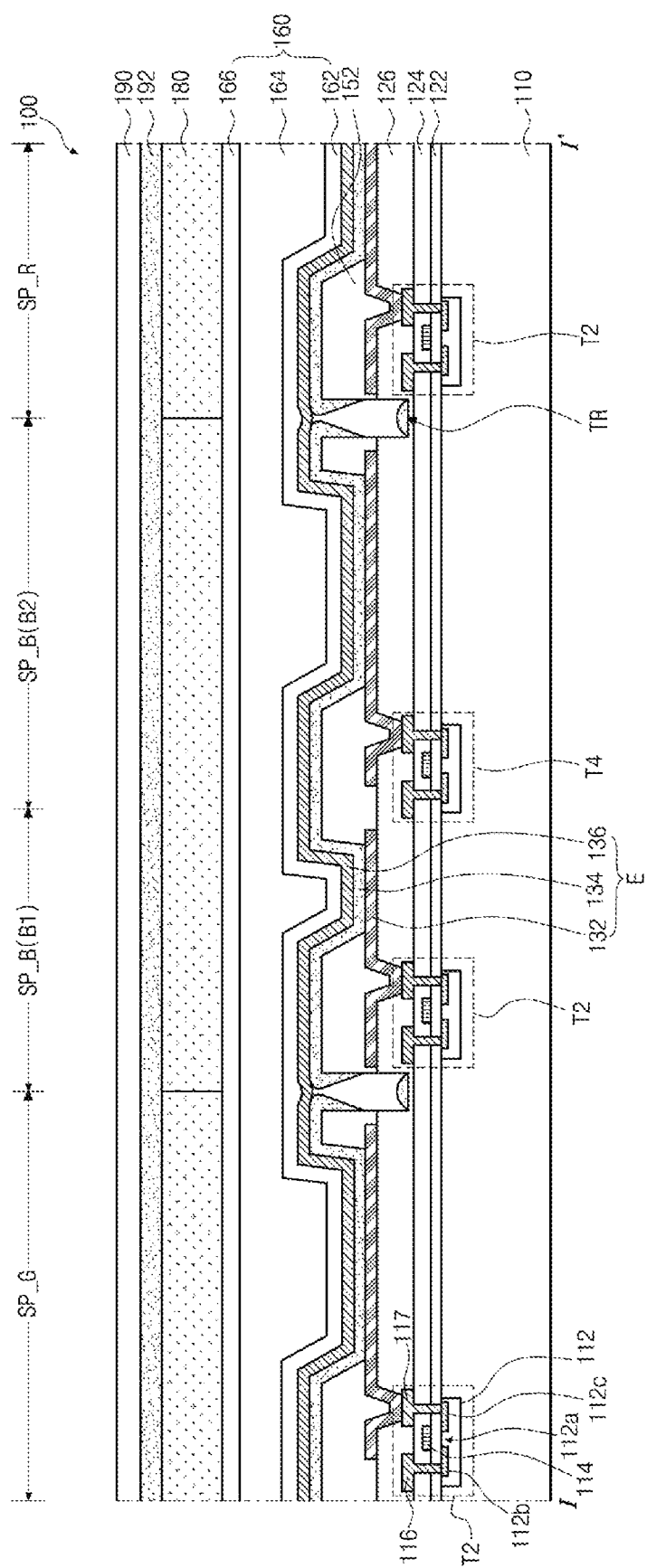
FIG. 7 is a cross-sectional view of the organic electroluminescence display device according to the first embodiment of the present disclosure.

Next, FIG. 7 is a cross-sectional view showing a specific structure of the organic electroluminescence display device 100 according to the first embodiment of the present disclosure.

In particular, FIG. 7 corresponds to a cross-section taken along the line I-I' of FIG. 6. For convenience of explanation, the G sub-pixel SP_G and the B sub-pixel SP_B are mainly shown in the figure. In addition, although a plurality of thin film transistors is disposed in each sub-pixel, each thin film transistor has substantially the same structure, so that only the driving thin film transistor T2 is shown in each of the G sub-pixel SP_G and the R sub-pixel SP_R and only the driving thin film transistor T2 and the emission control thin film transistor T4 are shown in the B sub-pixel SP_B. Because the driving thin film transistor T2 and the emission control thin film transistor T4 also have the same structure, they can be described as one thin film transistor for convenience of explanation.

As shown in FIG. 7, one or more thin film transistors T2 and T4 are disposed on the wafer substrate 110. In the figure, the driving thin film transistor T2 is disposed in each of the R sub-pixel SP_R and the G sub-pixel SP_G, and the driving thin film transistor T2 and the emission control thin film transistor T4 are disposed in the B sub-pixel SP_B including the first and second sub-emission regions B1 and B2. Here, the driving thin film transistor T2 can be disposed in the first sub-emission region B1, and the emission control thin film transistor T4 can be disposed in the second sub-emission region B2.

Each of the thin film transistors T2 and T4 includes an active region 112 disposed inside the wafer substrate 110, a gate insulation layer 122 formed on the wafer substrate 110, a gate electrode 114 disposed on the gate insulation layer 122, an interlayer insulation layer 124 formed on the gate electrode 114 and the gate insulation layer 122, and source and drain electrodes 116 and 117 disposed on the interlayer insulation layer 124. The wafer substrate 110 may be a single crystal silicon wafer formed by growing single crystal silicon (Si) but is not limited thereto. Alternatively, the wafer substrate 110 may be a wafer formed of various semiconductor materials.

The active region 112 can be formed inside the wafer substrate 110. A portion of the active region 112 of the wafer substrate 110 can be doped with impurities, so that the active region 112 includes a channel region 112a undoped with impurities at a central portion thereof and source and drain regions 112b and 112c doped the impurities at both sides of the channel region 112a.

The gate insulation layer 122 can be a single layer or multiple layers formed of an inorganic material such as SiOx or SiNx. However, the present disclosure is not limited thereto. The gate electrode 114 may be a single layer or multiple layers formed of a metal such as Cr, Mo, Ta, Cu, Ti, Al, or an Al alloy, but is not limited thereto.

In addition, the interlayer insulation layer 124 can be a single layer or multiple layers formed of an inorganic material such as SiOx or SiNx or be formed of an organic material such as photo acryl. Alternatively, the interlayer insulation layer 124 can be multiple layers of an organic material layer and an inorganic material layer.

Further, the source electrode 116 and the drain electrode 117 can be a single layer or multiple layers formed of a metal such as Cr, Mo, Ta, Cu, Ti, Al, or an Al alloy, but is not limited thereto. The source electrode 116 and the drain electrode 117 are in ohmic contact with the source region 112b and the drain region 112c of the active region 112 through contact holes formed in the gate insulation layer 122 and the interlayer insulation layer 124.

Also, a passivation layer 126 can be formed on the wafer substrate 110 on which the thin film transistors T2 and T4 are disposed. The passivation layer 126 may be formed of an organic material such as photo acryl but is not limited thereto.

A bank layer 152 is formed at a boundary of each sub-pixel SP_R, SP_G, and SP_B. In particular, the bank layer 152 is disposed between adjacent sub-pixels SP_R, SP_G, and SP_B. The bank layer 152 is a partition wall defining each sub-pixel SP_R, SP_G, and SP_B and partitions each sub-pixel SP_R, SP_G, and SP_B to prevent light of a specific color from being mixed with another color from the adjacent sub-pixel and output. The bank layer 125 is also formed between the sub-emission regions B1 and B2.

A trench TR is formed in the bank layer 152 and the passivation layer 126 and is disposed between adjacent sub-pixels SP_R, SP_G, and SP_B. More specifically, the trench TR is disposed between the G sub-pixel SP_G and the first sub-emission region B1 and between the R sub-pixel SP_R and the second sub-emission region B2. In this instance, the trench TR is formed to pass through the bank layer 152 and the passivation layer 126 or can be formed only in a portion of the bank layer 152.

Further, the organic light emitting diode E is formed on the passivation layer 126 and is electrically connected to the drain electrode 117 of the thin film transistor T2 and T4 through a contact hole formed in the passivation layer 126. More specifically, the organic light emitting diode E includes the first electrode 132 formed between the bank layers 152 and connected to the drain electrode 117 of the thin film transistor T2 and T4 through the contact hole, the organic light emitting layer 134 formed on the first electrode 132 and the bank layer 152, and the second electrode 136 formed on the organic light emitting layer 134.

In addition, the first electrode 132 can be a single layer or multiple layers formed of a metal such as Ca, Ba, Mg, Al, Ag, or their alloy or be formed of a transparent metal oxide such as indium tin oxide (ITO) or indium zinc oxide (IZO). The first electrode 132 is electrically connected to the drain electrode 117 of the thin film transistor T2 and T4 and receives an image signal from the outside.

When the first electrode 132 is formed of a transparent metal oxide, a reflective electrode of a metal with relatively high reflectance such as Al or Ag can be formed under the first electrode 132, so that the light efficiency is improved by reflecting light incident on the first electrode 132.

Further, the first electrode 132 is formed for each sub-pixel SP_R, SP_G, and SP_B, and a corresponding image signal is applied to the first electrode 132 of each sub-pixel SP_R, SP_G, and SP_B. In addition, the first electrode 132 is also formed for each sub-emission regions B1 and B2. Here, the first electrodes 132 of the first and second sub-emission regions B1 and B2 may have different widths.

For example, the width of the first electrode 132 of the first sub-emission region B1 can be narrower than the width of the first electrode 132 of the second sub-emission region B2. Further, the first electrodes 132 of the first and second sub-emission regions B1 and B2 can have different sizes. For example, the area of the first electrode 132 of the first sub-emission region B1 can be smaller than the area of the first electrode 132 of the second sub-emission region B2. However, the present disclosure is not limited thereto.

In addition, the organic light emitting layer 134 is formed on the first electrode 132 and the bank layer 152. The organic light emitting layer 134 can be formed over a substantially entire surface of the wafer substrate 110. The organic light emitting layer 134 may include one or more of a hole transporting layer, a hole injecting layer, a light emitting material layer, an electron transporting layer, and an electron injecting layer.

The organic light emitting layer 134 may be a white organic light emitting layer emitting white light substantially all over the display device 100. The organic light emitting layer 134 can also have a tandem structure in which two or more stacks are provided. Each stack can include a hole transporting layer, a light emitting material layer, and an electron transporting layer.

The light emitting material layer can be formed in a tandem structure in which a plurality of light emitting material layers is stacked. For example, the organic light emitting layer 134 can include a red (R) light emitting material layer, a green (G) light emitting material layer, and a blue (B) light emitting material layer which are stacked in a tandem structure, and red light, green light, and blue light output from the light emitting material layers can be mixed to output white light. In this instance, the hole transporting layer, the electron transporting layer, and a charge generation layer can be disposed between the light emitting material layers.

Alternatively, the organic light emitting layer 134 can include a yellow-green (Y-G) light emitting material layer and a blue (B) light emitting material layer which are stacked in a tandem structure, and yellow-green light and blue light emitted from the light emitting material layers can be mixed to output white light.

In the organic electroluminescence display device 100 according to the first embodiment of the present disclosure, the organic light emitting layer 134 outputting white light is not limited to the above-mentioned structures and may have various structures. The organic light emitting layer 134 can be formed substantially all over the wafer substrate 110 by an evaporation process or a solution process. Although the organic light emitting layer 134 is formed over the entire wafer substrate 110, the organic light emitting layer 134 can be partially disconnected by the trench TR.

In addition, when the organic light emitting layer 134 is formed in a tandem structure, some light emitting material layers and charge generation layer are disconnected by the trench TR, but the upper light emitting material layer can be connected without being disconnected over the trench TR. Accordingly, the organic light emitting layer 134 can be partially disconnected between the G sub-pixel SP_G and the first sub-emission region B1 and between the R sub-pixel SP_R and the second sub-emission region B2 by the trench TR.

In general, the lateral leakage current of the organic electroluminescence display device 100 is mainly transmitted to the adjacent sub-pixel through the hole transporting layer and the electron transporting layer of the organic light emitting layer 134. However, in the present disclosure, because the organic light emitting layer 134 is disconnected between the G sub-pixel SP_G and the first sub-emission region B1 of the B sub-pixel SP_B and between the R sub-pixel SP_R and the second sub-emission region B2 of the B sub-pixel SP_B, it is possible to prevent the leakage current from the G sub-pixel SP_G and/or the R sub-pixel SP_R from being transmitted to the first sub-emission region B1 and/or the second sub-emission region B2 of the B sub-pixel SP_B through the organic light emitting layer 134.

In addition, the second electrode 136 can be formed of a transparent conductive material such as indium tin oxide (ITO) or indium zinc oxide (IZO) or a thin metal through which visible light can pass but is not limited thereto. The second electrode 136 can also be formed to be connected all over the sub-pixels without being disconnected by the trench TR.

In the organic light emitting diode E having such a structure, when a voltage is applied to the first electrode 132 and the second electrode 136, holes and electrons move to the light emitting material layer through the hole transporting layer and the electron transporting layer, respectively, and are combined with each other in the light emitting material layer and separated to emit light.

In addition, the encapsulation layer 160 is formed on the second electrode 136 and can include a first encapsulation layer 162 of an inorganic material, a second encapsulation layer 164 of an organic material, and a third encapsulation layer 166 of an inorganic material. In this instance, the inorganic material may include SiNx and SiOx, but is not limited thereto. In addition, the organic material may include polyethylene terephthalate(PET), polyethylene naphthalate (PEN), polycarbonate(PC), polyimide(PI), polyethylene sulfonate(PES), polyoxymethylene(POM), polyarylate (PAR), or mixtures thereof, but is not limited thereto.

However, in the organic electroluminescence display device 100 according to the first embodiment of the present disclosure, the encapsulation layer 160 is not limited to the three-layer structure as described above, but can be formed in various structures. For example, the encapsulation layer 160 can be formed in a two-layer structure of an inorganic layer and an organic layer or may be formed in a structure of four or more layers.

Also, the color filter layer 180 is formed on the encapsulation layer 160. The color filter layer 180 includes the R color filter, the G color filter, and the B color filter formed in the R sub-pixel SP_R, the G sub-pixel SP_G, and the B sub-pixel SP_B, respectively.

When the white light emitted from the organic light emitting diode E passes through the color filter layer 180, the R color filter outputs red light and absorbs light in other wavelength banns except for the red light, the G color filter outputs green light and absorbs light in other wavelength banns except for the green light, and the B color filter outputs blue light and absorbs light in other wavelength banns except for the blue light. Here, the B color filter can be formed as one body all over the first sub-emission region B1 and the second sub-emission region B2 of the B sub-pixel SP_B.

In addition, an adhesive 192 is disposed on the color filter layer 192, and a protection member 190 is disposed on the adhesive 192. The protection member 190 is attached to the color filter layer 180 by the adhesive 192 and protects and encapsulates the organic electroluminescence display device 100 and may be formed of glass or a transparent film. A transparent protective film such as polystyrene (PS) film, a polyethylene (PE) film, a polyethylene naphthalate (PEN) film, or a polyimide (PI) film can be used as the transparent film. Further, the adhesive 192 may be an optical clear adhesive (OCA), but is not limited thereto, and various adhesive members may be used.

As described above, in the organic electroluminescence display device 100 according to the first embodiment of the present disclosure, the thin film transistor T2 and T4 is formed on the wafer substrate 110 of a single crystal semiconductor rather than a glass substrate or a plastic film. Even when the area of the sub-pixel is significantly reduced, a desired high-quality image can be displayed, so that a high-resolution display device can be implemented.

Additionally, because a black matrix for preventing light leakage is not formed between the sub-pixels SP_R, SP_G, and SP_B, the finer sub-pixels SP_R, SP_G, and SP_B can be formed, thereby implementing an ultra-high resolution display device.

Further, one pixel includes the R, G, and B sub-pixels SP_R, SP_G, and SP_B, and the B sub-pixel SP_B includes the first and second sub-emission regions B1 and B2. The total area of the B sub-pixel SP_B can be larger than the area of the R and G sub-pixels SP_R and SP_G, so that the decrease in the luminous efficiency can be compensated and the image of uniform luminance can be realized.

In addition, the trench TR is formed between the R, G, and B sub-pixels SP_R, SP_G, and SP_B, and the organic light emitting layer is disconnected between adjacent sub-pixels.

Accordingly, the lateral leakage current can be prevented from being generated along the organic light emitting layer, and thus the color shift due to the lateral leakage current can be prevented.

Also, the first sub-emission region B1 of the B sub-pixel SP_B is adjacent to the sub-pixel of a different color only on one side, not both sides. Accordingly, the leakage current applied from the adjacent sub-pixel to the first sub-emission region B1 is penetrated only through one sub-pixel of a different color, that is, the G sub-pixel SP_G, so that the leakage current applied to the first sub-emission region B1 can be reduced. Therefore, the color shift due to the lateral leakage current in the low gray level can be further effectively prevented.

Further, because the B sub-pixel SP_B is configured to have two sub-emission regions B1 and B2, approximately twice the current is applied to the first sub-emission region B1 of the B sub-pixel SP_B in the low gray level driving in which only the first sub-emission region B1 is driven. Accordingly, the first sub-emission region B1 is rapidly turned on, so that the color shift due to the turn-on delay of the B sub-pixel SP_B can be prevented.

In addition, the R, G, and B sub-pixels SP_R, SP_B, and SP_B are arranged in a specific form but is not limited thereto. The R, G, and B sub-pixels SP_R, SP_B, and SP_B may be arranged in various forms.

Figure 8A:
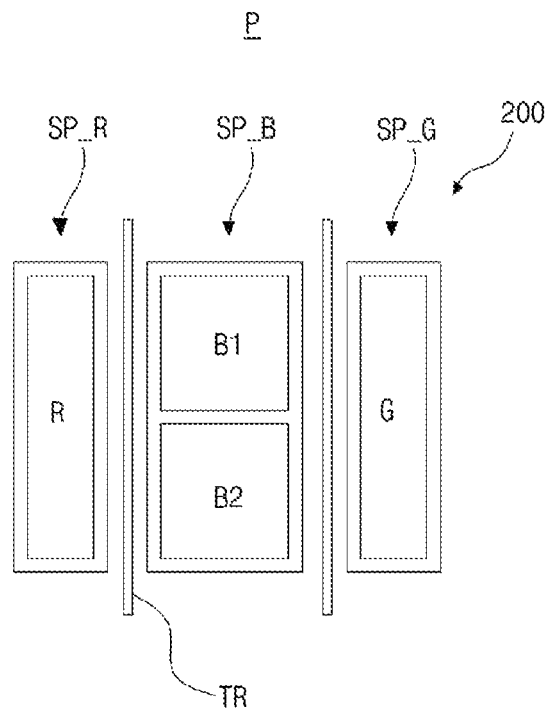
FIGS. 8A and 8B are plan views illustrating arrangements of sub-pixels of an organic electroluminescence display device according to a second embodiment of the present disclosure.
Figure 8B:
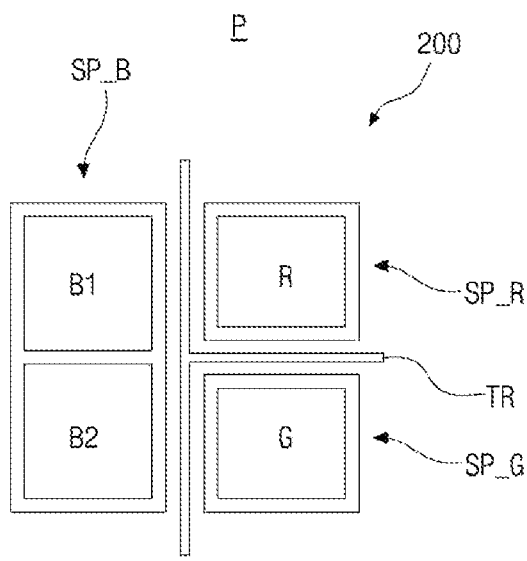

Next, FIGS. 8A and 8B are plan views illustrating arrangements of sub-pixels of an organic electroluminescence display device 200 according to a second embodiment of the present disclosure.

As shown in FIG. 8A, one pixel P includes an R sub-pixel SP_R, a G sub-pixel SP_G, and a B sub-pixel SP_B, and the B sub-pixel SP_B includes two sub-emission regions, that is, first and second sub-emission regions B1 and B2. Here, the R, G, and B sub-pixels SP_R, SP_G, and SP_B are arranged in a horizontal direction, for example, a longitudinal direction of a gate line, and a trench TR extending along a vertical direction, for example, a longitudinal direction of a data line is formed between the R, G, and B sub-pixels SP_R, SP_G, and SP_B. The horizontal direction can be parallel to the gate line, and the vertical direction may be parallel to the data line. In addition, the first and second sub-emission regions B1 and B2 are disposed along the vertical direction, that is, the longitudinal direction of the data line, and no trench is formed between the first and second sub-emission regions B1 and B2.

As shown in FIG. 8B, in the organic electroluminescence display device 200 according to another example of the second embodiment of the present disclosure, one pixel P includes an R sub-pixel SP_R, a G sub-pixel SP_G, and a B sub-pixel SP_B, and the B sub-pixel SP_B includes two sub-emission regions, that is, first and second sub-emission regions B1 and B2. Here, the R and G sub-pixels SP_R and SP_G and the first and second sub-emission regions B1 and B2 are arranged in a lattice shape. More particularly, the first and second sub-emission regions B1 and B2 are disposed along a vertical direction, that is, a longitudinal direction of a data line, and the R and G sub-pixels SP_R and SP_G are also disposed along the vertical direction, that is, the longitudinal direction of the data line. In addition, the R and G sub-pixels SP_R and SP_G are disposed adjacent to the first and second sub-emission regions B1 and B2 along a horizontal direction, that is, a longitudinal direction of a gate line. The R sub-pixel SP_R and the first sub-emission region B1 can be adjacent to each other along the horizontal direction, and the G sub-pixel SP_G and the second sub-emission region B2 may be adjacent to each other along the horizontal direction.

In addition, a trench TR is formed between the R, G, and B sub-pixels SP_R, SP_G, and SP_B. Specifically, the trench TR is disposed between the R and G sub-pixels SP_R and SP_G, between the R sub-pixel SP_R and the first sub-emission region B1, and between the G sub-pixel SP_G and the second sub-emission region B2. No trench is formed between the first and second sub-emission regions B1 and B2. The trench TR can extend along the horizontal direction between the R and G sub-pixels SP_R and SP_G and extend along the vertical direction between the R sub-pixel SP_R and the first sub-emission region B1 and between the G sub-pixel SP_G and the second sub-emission region B2 to thereby form one body.

Because the transistor is formed on the wafer substrate of a single crystal semiconductor rather than a glass substrate or a plastic film, a desired high-quality image can be displayed even when the area of the sub-pixel is significantly reduced, so that a high-resolution display device can be implemented. Additionally, because a black matrix for preventing light leakage is not formed between the sub-pixels, it is possible to form the finer sub-pixels, thereby implementing an ultra-high resolution display device.

Further, one pixel includes three sub-pixels, and one sub-pixel includes two sub-emission regions. The sub-pixel including the sub-emission regions is configured to have a larger area than the other sub-pixels, so that the decrease in the luminous efficiency can be compensated, thereby realizing the image of uniform luminance.

The trench is also formed between adjacent sub-pixels, thereby disconnecting some or all layers of the organic light emitting layer between adjacent sub-pixels. Accordingly, it is possible to prevent the leakage current from occurring along the organic light emitting layer, so that the color shift due to the leakage current can be prevented.

In addition, the first sub-emission region of one sub-pixel is adjacent to another sub-pixel of a different color only on one side, not both sides. Accordingly, the leakage current applied from the adjacent sub-pixel to the first sub-emission region is penetrated only through the other sub-pixel of a different color, so that the leakage current applied to the first sub-emission region can be reduced. Therefore, the color shift due to the lateral leakage current in the low gray level can be further effectively prevented.

Additionally, because the specific sub-pixel is configured to have two sub-emission regions, approximately twice the current is applied to the first sub-emission region in the low gray level driving in which only one sub-emission region is driven. Accordingly, the first sub-emission region is rapidly turned on, so that the color shift due to the turn-on delay of the corresponding sub-pixel can be prevented.

Features, structure, effects, etc. described in the above-mentioned embodiments are included in at least one example of the present application and are not necessarily limited to only one example. Further, the features, structures, effects, etc. illustrated in at least one example of the present application may be combined or modified with respect to other examples by those skilled in the art to which the present application belongs. Accordingly, the contents related to such combinations and modifications should be interpreted as being included in the scope of the present application.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. A display device comprising:
a plurality of pixels disposed on a substrate, wherein each pixel includes a first subpixel, a second subpixel adjacent to the first subpixel, and a third subpixel adjacent to the second subpixel;
wherein each of the first subpixel and the third subpixel include a single light emitting diode corresponding to a single light emission region, and
wherein the second subpixel includes a first light emitting diode corresponding to a first sub-emission region, and a second light emitting diode corresponding to a second sub-emission region;
a controller configured to control only the first light emitting diode of the second subpixel to emit light during a low gray level mode, and control the first light emitting diode and the second light emitting diode of the second subpixel to both emit light in a high gray level mode;
a first trench disposed between the first subpixel and the second subpixel and disconnecting an organic light emitting layer between the first subpixel and the second subpixel; and
a second trench disposed between the second subpixel and the third subpixel and disconnecting an organic light emitting layer between the second subpixel and the third subpixel.

2. The display device of claim 1, wherein the first light emitting diode and the second light emitting diode correspond to the first and second sub-emission regions emitting a blue color.

3. The display device of claim 1, wherein each of the first subpixel and the third subpixel comprises:
the single light emitting diode;
a switching thin film transistor having a drain electrode connected to a data line, a source electrode connected to a first node, and a gate electrode connected to a gate line, wherein the switching thin film transistor turns on based on a gate voltage supplied to the gate line and charges the first node with a data voltage applied to the data line;
a driving thin film transistor having a drain electrode connected to a high potential line, a source electrode connected to an anode of the single light emitting diode, and a gate electrode connected to the first node, wherein the driving thin film transistor turns on when a voltage of the first node is higher than a threshold voltage and turns off when the voltage of the first node is lower than the threshold voltage, and wherein the driving thin film transistor transfers a driving current received from the high potential line to the single light emitting diode;
a storage capacitor including an electrode connected to the first node and an electrode connected to the source electrode of the driving thin film transistor, wherein the storage capacitor maintains a potential difference between the gate electrode and the source electrode of the driving thin film transistor during an emission time when the single light emitting diode emits light to transmit a constant driving current to the single light emitting diode; and
a sensing thin film transistor including a drain electrode connected to a sensing line supplying a reference or initialization voltage, a source electrode connected to the source electrode of the driving thin film transistor, and a gate electrode connected to the gate line.

4. The display device of claim 1, wherein the second subpixel comprises:
the first and second light emitting diodes electrically connected to a same gate line and a same data line;
a switching thin film transistor having a drain electrode connected to the data line, a source electrode connected to a first node, and a gate electrode connected to the gate line, wherein the switching thin film transistor turns on based on a gate voltage supplied to the gate line and charges the first node with a data voltage applied to the data line;
a driving thin film transistor having a drain electrode connected to a high potential line, a source electrode connected to an anode of the first light emitting diode, and a gate electrode connected to the first node, wherein the driving thin film transistor turns on when a voltage of the first node is higher than a threshold voltage and turns off when the voltage of the first node is lower than the threshold voltage, and wherein the driving thin film transistor transfers a driving current received from the high potential line to the first light emitting diode;
a storage capacitor including an electrode connected to the first node and an electrode connected to the source electrode of the driving thin film transistor, wherein the storage capacitor maintains a potential difference between the gate electrode and the source electrode of the driving thin film transistor during an emission time when the first light emitting diode emits light to transmit a constant driving current to the first light emitting diode;
a sensing thin film transistor including a drain electrode connected to a sensing line supplying a reference or initialization voltage, a source electrode connected to the source electrode of the driving thin film transistor, and a gate electrode connected to the gate line, wherein the sensing thin film transistor senses the threshold voltage of the driving thin film transistor; and
an emission control thin film transistor having a gate electrode connected to the first node, a drain electrode connected to the source electrode of the sensing thin film transistor, and a source electrode connected to an anode of the second light emitting diode.

5. The display device of claim 4, wherein the emission control thin film transistor blocks the current applied to the second light emitting diode in the low gray level mode to drive only the first light emitting diode and allows the current to flow through the second light emitting diode in the high gray level mode to drive both of the first and second light emitting diodes.

6. The display device of claim 4, wherein the driving thin film transistor and the emission control thin film transistor of the second subpixel are disposed on the substrate between the driving thin film transistor of the first subpixel and the driving thin film transistor of the second subpixel,
wherein a first bank overlaps the driving thin film transistor of the first subpixel, a second bank overlaps the driving thin film transistor of the second subpixel, a third bank overlaps the emission control thin film transistor of the second subpixel, and a fourth bank overlaps the driving thin film transistor of the third subpixel, and wherein the organic light emitting layer is disposed over the first, second, third and fourth banks, and a common electrode is continuously disposed over the organic light emitting layer.

7. The display device of claim 6, wherein the first trench passes though the organic light emitting layer and the second bank, and the second trench passes through the organic light emitting layer and the fourth bank.

8. The display device of claim 1, wherein a trench is omitted between the first sub-emission region and the second sub-emission region in the second subpixel.

9. The display device of claim 1, wherein the first and second sub-emission regions of the second subpixel are adjacent to each other along a longitudinal direction of a gate line.

10. The display device of claim 1, wherein an area of the second subpixel is larger than an area of the first subpixel or the third subpixel.

11. The display device of claim 1, wherein the first sub-emission region is adjacent to the first subpixel and adjacent to the second sub-emission region, and
wherein the second sub-emission region is adjacent to the third subpixel and the first sub-emission region.

12. The display device of claim 1, wherein the first sub-emission region and the second sub-emission region of the second subpixel are adjacent to only one sub-pixel of a different color.

13. The display device of claim 1,
wherein the first subpixel emits green light, the second subpixel emits blue light, and the third subpixel emits red light.

14. The display device of claim 1, wherein the first sub-emission region occupies a same area as the second sub-emission region of the second subpixel.

15. The display device of claim 1, wherein the first sub-emission region is disposed above the second sub-emission region.

16. The display device of claim 1, wherein the second subpixel is disposed between the first subpixel and the third subpixel.

17. The display device of claim 16, wherein the first sub-emission region is disposed above the second sub-emission region.

18. The display device of claim 1, wherein the first subpixel is disposed above the third subpixel, and the second subpixel is disposed adjacent to the first and third subpixels.

19. The display device of claim 18, wherein the first sub-emission region of the second subpixel is disposed above the second sub-emission region of the second subpixel.

* * * * *